United States Patent [19]
Lim et al.

[11] Patent Number: 5,804,338
[45] Date of Patent: Sep. 8, 1998

[54] PHOTOLITHOGRAPHY MASKS INCLUDING PHASE-SHIFTING LAYERS AND RELATED METHODS AND STRUCTURES

[75] Inventors: Sung-chul Lim; Seong-yong Moon, both of Kyungki-do, Rep. of Korea

[73] Assignee: Samsung Electronics Co., Ltd., Kyungki-do, Rep. of Korea

[21] Appl. No.: 742,247

[22] Filed: Oct. 31, 1996

[51] Int. Cl.⁶ ................................................ G03F 9/00
[52] U.S. Cl. ................................................................ 430/5
[58] Field of Search ............................... 430/5, 322, 323, 430/324

[56] References Cited

U.S. PATENT DOCUMENTS 5,536,602  7/1996  Nakao ........................................ 430/5
5,660,956  8/1997  Tomofuji et al. ......................... 430/5

OTHER PUBLICATIONS

Naoyuki Ishiwata et al., *Fabrication of Phase–Shifting Mask*, SPIE, vol. 1463, Optical/Laser Microlithography IV(Jan. 1991), pp. 423–433.

Marc D. Levenson et al., *Improving Resolution In Photolithography With A Phase–Shifting Mask*, IEEE Transactions On Electron Devices, vol. ED–29, No. 12, Dec. 1982, pp. 1828–1836.

*Primary Examiner*—S. Rosasco
*Attorney, Agent, or Firm*—Myers, Bigel, Sibley & Sajovec

[57] ABSTRACT

A phase-shifting mask is provided for irradiating a microelectronic wafer having first and second wafer regions wherein the first wafer region has a large step difference relative to the second wafer region. The phase-shifting mask includes a substrate which transmits light therethrough and a patterned layer of a phase shifting material which shifts a phase of light transmitted by the substrate. The phase-shifting mask also includes a layer which controls the transmissivity of light through the phase-shifting mask so that a transmissivity of light through a first mask region is small relative to a transmissivity of light through a second mask region wherein the first mask region corresponds to the first wafer region and the second mask region corresponds to the second wafer region. Related masks and structures are also discussed.

16 Claims, 4 Drawing Sheets

PHOTOLITHOGRAPHY MASKS INCLUDING PHASE-SHIFTING LAYERS AND RELATED METHODS AND STRUCTURES

FIELD OF THE INVENTION

The present invention relates to the field of microelectronics and more particularly to the field of microelectronic fabrication.

BACKGROUND OF THE INVENTION

When manufacturing integrated circuits, selected portions of a semiconductor substrate can be implanted by providing a patterned masking layer on portions of the substrate which are not to be implanted. Patterned masking layers are used to define features for other microelectronic fabrication steps such as etching, deposition, and oxidation. The patterned masking layers can be formed by photolithographic techniques known to those having skill in the art. These photolithographic techniques can be used to precisely expose selected portions of the substrate having fine patterns.

Photolithographic patterning techniques, however, may generate pattern defects as a result of a "proximity effect" caused by light diffraction. In particular, light diffraction may round out square patterns, and this rounding out may become more severe as the integration density of the integrated circuit device increases. The use of a phase-shift mask has been suggested to improve optical contrast and resolution. See, Levenson et al., "Improving Resolution in Photolithography with a Phase-Shifting Mask," IEEE Trans. Elect. Devices, Vol. ED-29, No. 12, pp. 1828–1836, 1982; and Naoyuki Ishiwata et al., "Fabrication of Phase-Shifting Mask," SPIE, Vol. 1463, Optical/Laser Microlithography IV, 1991, pp. 423–433.

In a phase-shift mask, a patterned phase-shifting layer is formed on a transparent substrate. When using the phase-shift mask to form a pattern on a substrate, the resolution or depth of focus can be increased by exposing the photoresist layer using interference or partial interference of light. For example, an iterative pattern such as a line-space pattern can be formed when the phase of light transmitted from an adjacent aperture is shifted by 180°. The adjacent aperture is separated because the intensity of the light of a shaded portion between the two apertures becomes 0.

When light passes through a mask substrate or a phase-shifting layer, the wavelength of the light is reduced to a value divided by the refractive index of the medium under a vacuum. Accordingly, when light of the same phase passes through the mask, the wavelength changes as a function of the existence or non-existence of the phase-shifting layer. The difference in the light path θ can be determined according to the following formula:

$$\theta = \frac{2\pi t(n-1)}{\lambda}.$$

In this formula, n is the refractive index of the phase-shifting layer, t is the thickness of the phase-shifting layer, and λ is the wavelength of the light beam used.

When θ equals π, the light beam passing through the phase-shifting layer has a phase opposite that of light not passing through the phase-shifting layer. Accordingly, the phase differences of the light passing through light transmission portions of the mask and light passing through phase-shifting portions of the mask cause the intensity of the light which passes through the mask to become 0 at the boundaries therebetween. The contrast increases at the boundary of the pattern when the phase-shifting portion is located at the edge of the mask pattern. A phase-shifting mask employing the principles discussed above may be a half tone phase-shifting mask in which the light transmissivity of a shaded portion is increased from 0 to a value which is greater than 0. Because the half tone phase-shifting mask can be used in the manufacture of integrated circuit devices of various designs, it can be effectively used for iterative patterns such as line-space and contact hole patterns.

Methods for forming patterned layers using phase-shifting masks can provide improved resolution when compared to methods using conventional masks. In particular, resolution can be improved on the order of 30% by making a reverse use of the diffraction of light.

FIG. 1 illustrates a cross-sectional view of a conventional half tone phase-shifting mask. This mask includes a glass substrate 10 and a patterned half tone phase-shifting layer 12. In the mask, 100% of the light intensity is transmitted through the substrate. In contrast, 6% to 12% of the light intensity is transmitted through the half tone phase-shifting layer.

FIGS. 2A through 2C are cross-sectional views illustrating steps in a method for forming a pattern using a conventional half tone phase-shifting mask. In FIG. 2A, a patterned photosensitive layer 22 is formed on the semiconductor substrate 20 by transferring the pattern of the half tone phase-shifting mask. As shown, an undesirable loss of the photosensitive layer may result because of the 6% to 12% intensity of the light which is transmitted by the patterned half tone phase-shifting layer 12 of FIG. 1. This undesirable loss of the photosensitive layer is referred to as the "side-lobe phenomenon", and the missing material is indicated by the reference character A of FIG. 2A. The photosensitive layer loss due to the "side-lobe phenomenon" may be negligible on a flat surface such as a bare wafer, but the effects may be severe when the wafer includes steps.

In FIG. 2B, the "side-lobe phenomenon" may be magnified when the microelectronic wafer includes steps such as the unevenness in layer 26. In particular, a significant step is formed because the insulating layer 26 is formed on the wafer including the substrate 20, the electrodes 24, and the patterned electrodes 24. When light is irradiated on the photosensitive layer 22 formed on the wafer including steps, irregular reflection of light may occur. In particular, the insulating layer 26 may be reflective and irregular reflection may occur at the dip in the insulating layer 26 between the electrodes 24. Undesired exposure can be severe because the light reflected from the irregular surface can be focused thus damaging the photoresist layer.

FIG. 2C is a cross-sectional view illustrating the result of the pattern transfer to the photosensitive layer 22. As shown, an undesired exposure of the photosensitive layer 22 occurs in a portion thereof where a step difference is most severe. As shown, a hole may result thus undesirably exposing a portion of the insulating layer 26 as indicated by the reference character B. Accordingly, there continues to exist a need in the art for improved masks and methods for exposing photosensitive layers.

SUMMARY OF THE INVENTION

It is therefor an object of the present invention to provide improved masks, methods, and structures for transferring patterns to photosensitive layers.

It is another object of the present invention to provide masks, methods, and structures which reduce the "side-lobe phenomenon".

These and other objects are provided according to the present invention by a phase-shifting mask including a substrate which transmits light therethrough, a patterned layer of a phase shifting material which shifts a phase of light transmitted by the substrate, and means for controlling the transmissivity of light passed through the phase-shifting layer. In particular, the transmissivity is controlled so that a transmissivity of light through a first mask region is small relative to a transmissivity of light through a second mask region wherein the first mask region corresponds to a first wafer region having a relatively large step difference and the second mask region corresponds to a second wafer region having a relatively small step difference. Accordingly, irregular reflections from the regions of the wafer having relatively large step differences can be reduced thus reducing the "side-lobe phenomenon".

In particular, the transmissivity controlling means includes a layer of a light transmissivity controlling material on the first mask region. This light transmissivity controlling material can be Cr, Al, Au, Pt, photoresist, spin on glass (SOG), CrO, CrON, $MoSi_x$, MoSiO, MoSiON, W, or $WSi_x$. Furthermore, the transmissivity controlling material can be a patterned layer of the transmissivity controlling material on portions of the patterned phase-shifting layer in the first mask region.

According to an alternate aspect of the present invention, a method for forming a phase-shifting mask includes the steps of forming a layer of a phase-shifting material on a substrate which transmits light and forming a layer of a material which controls light transmissivity on the layer of the phase-shifting material. The phase-shifting and transmissivity controlling layers are then patterned using a masking layer. Portions of the transmissivity controlling layer can then be selectively removed using a second mask. Accordingly, the patterned transmissivity controlling layer can be selectively provided on portions of the mask corresponding to portions of the wafer having relatively large step differences thus reducing irregular reflections during photo-lithographic processing.

More particularly, the removing step can include the steps of forming a masking layer which selectively exposes the region of the mask corresponding to the second wafer region, and etching portions of the transmissivity controlling layer on the exposed region of the mask. In addition, the transmissivity controlling layer reduces the transmission of light therethrough, and the transmissivity controlling layer can be formed from a material chosen from the group consisting of Cr, Al, Au, Pt, photoresist, spin on glass (SOG), CrO, CrON, $MoSi_x$, MoSiO, MoSiON, W, and $WSi_x$.

According to still another aspect of the present invention, a method for forming a pattern on a microelectronic wafer includes the steps of forming a first layer on the wafer, and forming a second anti-reflective layer on the first layer. A photosensitive layer is then formed on the anti-reflective layer, selectively exposed to electromagnetic radiation, and developed so that portions of the anti-reflective layer are exposed. The anti-reflective material can be formed from materials such as polymers, oxides, nitrides, carbides, and photoresist. Furthermore, the anti-reflective layer can have a thickness on the order of 1,000 Angstroms. Reflection of light from behind the photosensitive layer can thus be reduced thereby reducing undesired exposure of the photosensitive layer. In particular, the anti-reflective layer can be used to reduce reflections at regions of the microelectronic wafer having relatively large step differences thereby reducing the "side-lobe phenomenon".

By providing a patterned transmissivity controlling layer on regions of a mask corresponding to regions of a microelectronic substrate having relatively large step differences as discussed above, reflections from uneven portions of the wafer can be reduced. Undesired reflections can alternately be reduced by providing an anti-reflective layer. Accordingly, the "side-lobe phenomenon" can be reduced.

DETAILED DESCRIPTION

Figure 1:
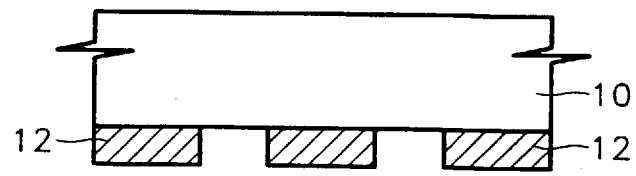
FIG. 1 is a cross-sectional view illustrating a half tone phase-shifting mask according to the prior art.
Figure 2A:
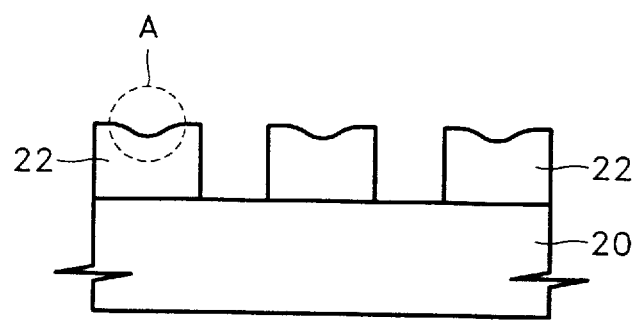
FIGS. 2A–2C are cross-sectional views illustrating steps of a method for forming a patterned layer using a half tone phase-shifting mask according to the prior art.
Figure 2B:
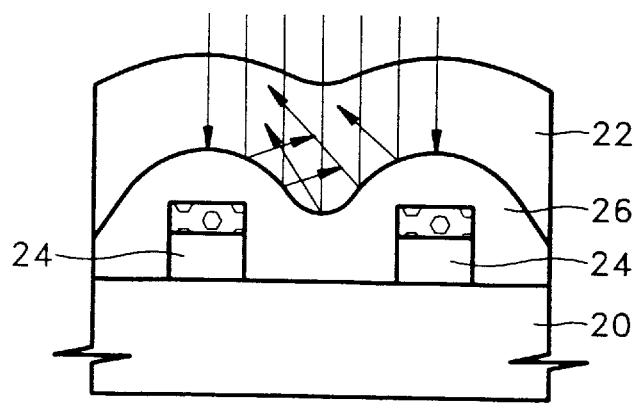
Figure 2C:
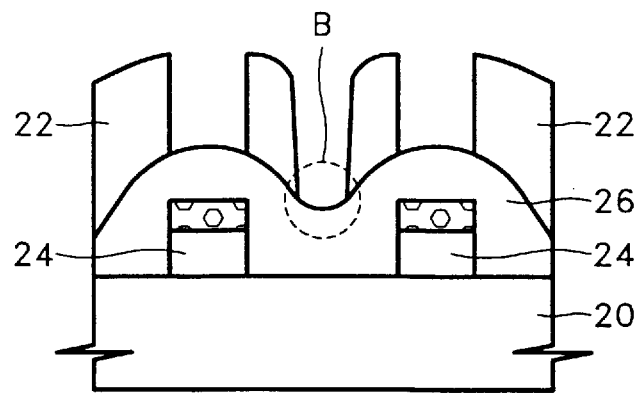

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 3:
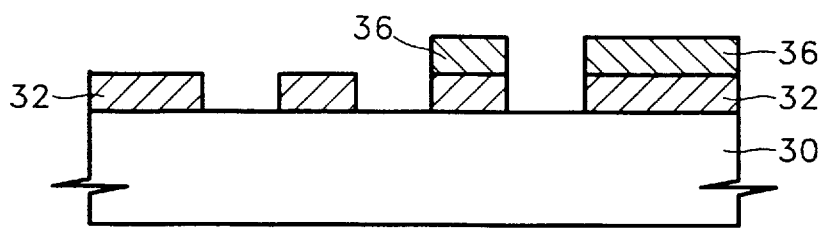
FIG. 3 is a cross-sectional view illustrating a half tone phase-shifting mask according to the present invention.

FIG. 3 is a cross-sectional view illustrating a half tone phase-shifting mask according to the present invention. As shown, this mask includes a glass substrate 30, a patterned half tone phase-shifting layer 32, and a patterned light transmissivity controlling layer 36. The half tone phase-shifting layer 32 and the light transmissivity controlling layer 36 are formed together on a region of the mask corresponding to a region of the microelectronic wafer having a relatively large step difference. For example, the two layers can be formed together on regions of the mask corresponding to regions of the wafer having peripheral circuits. The half tone phase-shifting layer 32 is provided without the transmissivity controlling layer on regions of the mask corresponding to regions of the wafer having a relatively small step difference. For example, a cell array region of the wafer may have a relatively small step difference. In particular, the light transmissivity controlling layer 36 is formed from a material which reduces the transmissivity of light therethrough. This layer can be formed from materials such as Cr, Al, Au, Pt, a photosensitive material, spin on glass (SOG), CrO, CrON, $MoSi_x$, MoSiO, MoSiON, W, or $WSi_x$.

In the mask discussed above, the transmissivity controlling layer is formed together with the phase-shifting layer on portions of the mask corresponding to regions of the wafer wherein relatively large step differences may result in the undesirable exposure of the photosensitive layer. Accordingly, the effects of the "side-lobe phenomenon" can be reduced because the amount of light irradiated onto the region in which the step difference is relatively large is less than the intensity of the light irradiated onto other regions of the wafer.

Figure 4A:
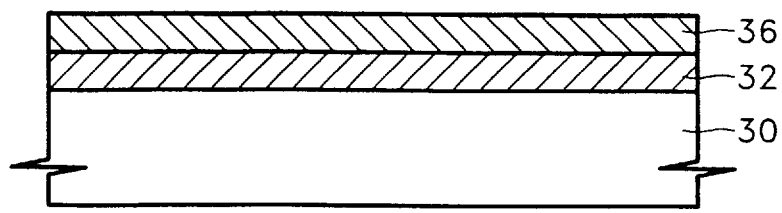
FIGS. 4A–4E are cross-sectional views illustrating steps of a method for forming a half tone phase-shifting mask according to the present invention.
Figure 4B:
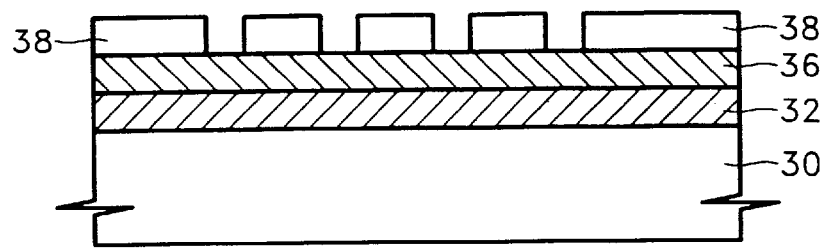

FIGS. 4A–4E are cross-sectional views illustrating steps of a method for forming a half tone phase-shifting mask according to the present invention. As shown in FIG. 4A, a half tone phase-shifting layer 32 and a light transmissivity controlling layer 36 are formed on the substrate 30. The half tone phase-shifting layer 32 can be formed by depositing a phase-shifting material which can shift the phase of light transmitted therethrough. The phase-shifting material can also change the transmissivity of light transmitted therethrough. The phase-shifting material can be MoSiON or CrON or other phase-shifting materials or combinations thereof. The light transmissivity controlling layer 36 is formed on the half tone phase-shifting layer 32. The light transmissivity controlling layer 36 is formed from a material which reduces the transmission of light therethrough and can be formed from a material such as Cr, Al, Au, Pt, a photosensitive material, spin on glass (SOG), CrO, CrON, $MoSi_x$, MoSiO, MoSiON, W, or $WSi_x$. In FIG. 4B, a first patterned photosensitive layer 38 is formed on the transmissivity controlling layer 36. After coating a photosensitive layer on the light transmissivity controlling layer 36, the first patterned photosensitive layer 38 is formed by exposing and developing the photosensitive layer. Accordingly, portions of the transmissivity controlling layer 36 are exposed.

Figure 4C:
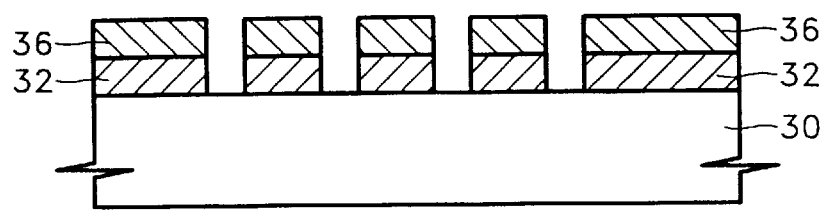

The half tone phase-shifting layer 32 and the light transmissivity controlling layer 36 are then patterned as shown in FIG. 4C. In particular, a wet etch is performed on the light transmissivity controlling layer 36 using the first patterned photosensitive layer 38 as an etching mask. A dry etching step can then be used to etch exposed portions of the half tone phase-shifting layer 32 to expose portions of the substrate 30. The first patterned photosensitive layer 38 is then removed.

Figure 4D:
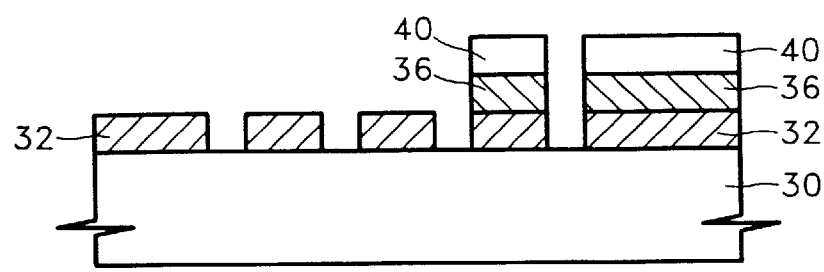

A second patterned photosensitive layer 40 is then formed as shown in FIG. 4D. After coating the surface of the wafer with a photosensitive layer, the second patterned photosensitive layer 40 is formed on the region of the mask on which the light transmissivity controlling layer is desired. The patterning of the second photosensitive layer is achieved by selectively exposing and developing the photosensitive layer. As discussed above, the second patterned photosensitive layer 40 exposes portions of the transmissivity controlling layer 36 on regions of the mask corresponding to regions of the microelectronic wafer having relatively small step differences. For example, relatively small step differences may occur on cell array regions of the wafer. Accordingly, the transmissivity controlling layer 36 can be removed from these portions of the mask.

Figure 4E:
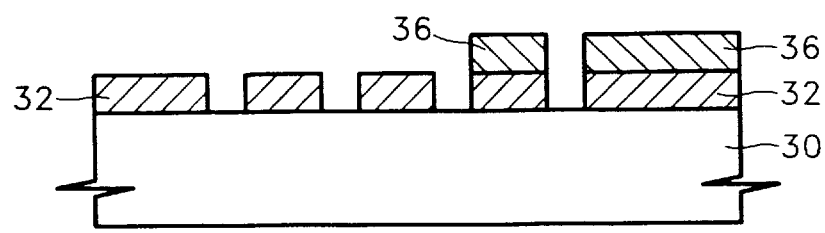

The second patterned photosensitive layer 40 is maintained on regions of the mask corresponding to regions of the wafer wherein step differences are relatively large. For example, step differences may be relatively large on peripheral circuit regions of the wafer. Exposed portions of the transmissivity controlling layer 36 are removed as shown in FIG. 4E. The second patterned photoresist layer 40 has also been removed. In particular, portions of the transmissivity controlling layer 36 have been removed using the second patterned photosensitive layer 40 as a mask. Accordingly, the completed half tone phase-shifting mask of the present invention includes a light transmissivity controlling layer on the phase-shifting layer in regions of the mask corresponding to regions of the wafer wherein step differences are relatively large. For example, the light transmissivity controlling layer 36 can be maintained on regions corresponding to peripheral circuit regions of the microelectronic wafer.

Figure 5:
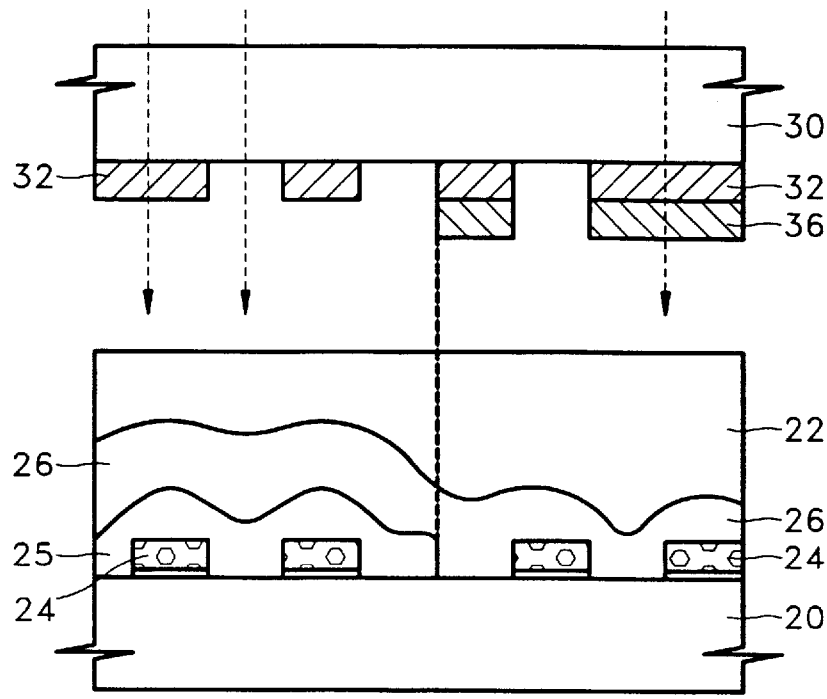
FIG. 5 is a cross-sectional view illustrating a method for transferring a pattern to a photosensitive layer according to the present invention.

A method for transferring a pattern from a half tone phase-shifting mask of the present invention to a microelectronic wafer including regions having relatively small and large step differences is illustrated in FIG. 5. As shown, the mask includes a glass substrate 30, a patterned half-tone phase-shifting layer 32, and a patterned light transmissivity controlling layer 36. The microelectronic wafer includes a substrate 20, gate electrodes 24, a first insulating layer 25, a second insulating layer 26, and a photosensitive layer 22. As shown, the region of the wafer including both insulating layers 25 and 26 has a relatively small step difference while the region of the wafer including only insulating layer 26 has a relatively large step difference.

The patterned light transmissivity controlling layer 36 is provided on the phase-shifting layer 32 on a region of the mask corresponding to a region of the wafer having a relatively large step difference. Because the transmission of light passing through the light transmissivity controlling layer 36 is reduced, the intensity of the light transmitted to the photosensitive layer on regions of the wafer having a relatively large step difference is reduced. Accordingly, a pattern can be reliably formed because the effects of the "side-lobe phenomenon" are reduced. In particular, reflection from the step in the insulating layer 26 between the two electrodes 24 is reduced because the intensity of the light is reduced.

Figure 6:
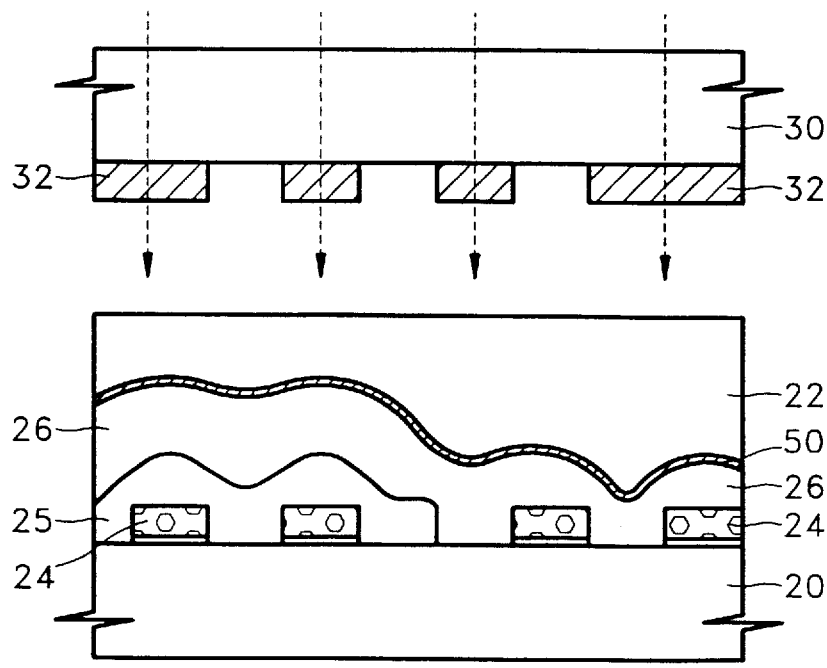
FIG. 6 is a cross-sectional view illustrating a second method for transferring a pattern to a photosensitive layer according to the present invention.

A second aspect of the present invention is illustrated in FIG. 6. According to this aspect, a conventional half tone phase shifting mask can be used to transfer a pattern to a photosensitive layer while reducing the effects of the "side-lobe phenomenon". As shown in FIG. 6, an anti-reflective layer 50 is formed on the insulating layer 26 including the step difference. The anti-reflective layer can be formed by depositing a layer of a material which prevents reflection, and this layer can be deposited to a thickness on the order of 1,000 Angstroms. The photosensitive layer 22 is then provided on the anti-reflective layer 50. The photosensitive layer is then patterned by selectively exposing and developing the photosensitive layer using a conventional half tone phase shifting mask. Accordingly, patterns can be reliably formed on portions of the wafer having relatively large step differences because light is not reflected up from under the photosensitive layer. The anti-reflective layer 50 is formed from a material having a low reflection rate. For example, materials such as polymers, oxides, nitrides, carbides, or photoresist can be used.

According to the present invention, patterns can be reliably formed by reducing the effects of the "side-lobe phenomenon" which is caused by irregular reflections. In particular, the irregular reflections can be reduced by providing a transmissivity controlling layer on regions of the mask corresponding to regions of the wafer likely to produce irregular reflections such as regions of the wafer having relatively large step differences. Alternately, an anti-reflective layer can be provided on the layer to be patterned prior to forming the photosensitive layer.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A phase-shifting mask for irradiating a microelectronic wafer having first and second wafer regions wherein the first wafer region has a large step difference relative to the second wafer region, said phase shifting mask comprising:

a substrate which transmits light therethrough;

a patterned layer of a phase shifting material on said substrate, wherein said phase shifting layer shifts a phase of light transmitted by said substrate, and wherein said patterned layer of said phase shifting material comprises a first phase shifting mesa on a first mask region and a second phase shifting mesa on a second mask region wherein said first mask region corresponds to the first wafer region and said second mask region corresponds to the second wafer region; and means for controlling the transmissivity of light through said first phase shifting mesa of said phase-shifting mask wherein said second phase shifting mesa is free of said means of controlling the transmissivity of light therethrough so that a transmissivity of light through said first phase shifting mesa is small relative to a transmissivity of light through said second phase shifting mesa.

2. A phase-shifting mask according to claim 1 wherein said transmissivity controlling means comprises a layer of a light transmissivity controlling material on said first phase shifting mesa and wherein said second phase shifting mesa is free of said light transmissivity controlling material.

3. A phase-shifting mask according to claim 2 wherein said light transmissivity controlling material is chosen from the group consisting of Cr, Al, Au, Pt, photoresist, spin on glass (SOG), CrO, CrON, $MoSi_x$, MoSiO, MoSiON, W, and $WSi_x$.

4. A phase-shifting mask according to claim 2 wherein said layer of said transmissivity controlling material comprises a patterned layer of said transmissivity controlling material on portions of said patterned phase-shifting layer in said first mask region but not in said second mask region.

5. A method for forming a phase-shifting mask for patterning a microelectronic wafer having first and second wafer regions wherein the first wafer region has a large step difference relative to the second wafer region, said method comprising the steps of:

forming a layer of a phase-shifting material on a substrate which transmits light therethrough;

forming a layer of a material which controls light transmissivity on said layer of said phase-shifting material;

patterning said phase-shifting and transmissivity controlling layers using a first masking layer to provide a first phase-shifting mesa on a first region of said mask corresponding to the first wafer region and a second phase-shifting mesa on a second region of said mask corresponding to the second wafer region; and removing portions of said transmissivity controlling layer from said second phase-shifting mesa on said second region of said mask corresponding to the second wafer region so that said first phase-shifting mesa includes said light transmissivity controlling layer thereon and so that said second phase-shifting mesa is free of said light transmissivity controlling layer.

6. A method according to claim 5 wherein said removing step comprises the steps of:

forming a masking layer which selectively exposes said region of said mask corresponding to the second wafer region; and etching portions of said transmissivity controlling layer on said exposed region of said mask.

7. A method according to claim 5 wherein said transmissivity controlling layer reduces the transmission of light therethrough.

8. A method according to claim 7 wherein said transmissivity controlling layer is formed from a material chosen from the group consisting of Cr, Al, Au, Pt, photoresist, spin on glass (SOG), CrO, CrON, $MoSi_x$, MoSiO, MoSiON, W, and $WSi_x$.

9. A method for forming a phase-shifting mask, said method comprising the steps of:

forming a layer of a phase-shifting material on a substrate which transmits light therethrough;

forming a layer of a material which controls light transmissivity on said layer of said phase-shifting material;

patterning said phase-shifting and transmissivity controlling layers using a first masking layer to provide a first phase-shifting mesa on a first region of said mask and a second phase-shifting mesa on a second region of said mask; and selectively removing portions of said transmissivity controlling layer from said second phase-shifting mesa using a second mask.

10. A method according to claim 9 wherein said removing step comprises the steps of:

forming a second masking layer which selectively exposes said region of said mask corresponding to the second wafer region; and etching portions of said transmissivity controlling layer on said exposed region of said mask.

11. A method according to claim 9 wherein said transmissivity controlling layer reduces the transmission of light therethrough.

12. A method according to claim 11 wherein said transmissivity controlling layer is formed from a material chosen from the group consisting of Cr, Al, Au, Pt, photoresist, spin on glass (SOG), CrO, CrON, $MoSi_x$, MoSiO, MoSiON, W, and $WSi_x$.

13. A phase-shifting mask comprising:

a substrate which transmits light therethrough;

a patterned layer of a phase-shifting material on said substrate wherein said patterned layer of said phase-shifting material comprises first and second phase-shifting mesas on said substrate; and a patterned layer of a material which controls light transmissivity on said patterned layer of said phase-shifting material wherein said transmissivity controlling material covers said first phase-shifting mesa and wherein said second phase-shifting mesa is free of said transmissivity controlling material.

14. A phase-shifting mask according to claim 13 wherein said patterned phase-shifting layer covers first and second regions of the mask and wherein said patterned layer of said transmissivity controlling material covers only the first region of the mask.

15. A phase-shifting mask according to claim 13 wherein said transmissivity controlling layer reduces the transmission of light therethrough.

16. A phase-shifting mask according to claim 15 wherein said transmissivity controlling layer comprises a material chosen from the group consisting of Cr, Al, Au, Pt, photoresist, spin on glass (SOG), CrO, CrON, $MoSi_x$, MoSiO, MoSiON, W, and $WSi_x$.

* * * * *